(12) United States Patent
Lester et al.

(10) Patent No.: US 7,622,746 B1
(45) Date of Patent: Nov. 24, 2009

(54) HIGHLY REFLECTIVE MOUNTING ARRANGEMENT FOR LEDS

(75) Inventors: Steven D. Lester, Palo Alto, CA (US);
Frank Shum, Sunnyvale, CA (US);
Chao-Kun Lin, Sunnyvale, CA (US);
William So, Sunnyvale, CA (US);
Qingwei Mo, Sunnyvale, CA (US)

(73) Assignee: Bridgelux, Inc., Sunnyvale, CA (US)

( * ) Notice: Subject to any disclaimer, the term of this patent is extended or adjusted under 35 U.S.C. 154(b) by 314 days.

(21) Appl. No.: 11/378,763

(22) Filed: Mar. 17, 2006

(51) Int. Cl.
*H01L 31/0232* (2006.01)

(52) U.S. Cl. ............... 257/98; 257/99; 257/E33.064; 257/E33.068

(58) Field of Classification Search ............... 257/79, 257/98, 99, E33.068, E33.072, E33.064
See application file for complete search history.

(56) References Cited

U.S. PATENT DOCUMENTS

| | | | |
|---|---|---|---|
| 5,585,648 A | 12/1996 | Tischler | |
| 6,492,661 B1 | 12/2002 | Chien et al. | |
| 6,552,369 B2 | 4/2003 | Chiou et al. | |
| 6,657,236 B1 * | 12/2003 | Thibeault et al. | ............. 257/98 |
| 6,784,462 B2 | 8/2004 | Schubert | |
| 6,797,987 B2 | 9/2004 | Chen | |
| 6,858,873 B2 * | 2/2005 | Lee | ............................ 257/81 |
| 6,992,334 B1 | 1/2006 | Wierer, Jr. et al. | |
| 7,355,212 B2 * | 4/2008 | Okazaki et al. | ............... 257/98 |
| 7,375,380 B2 * | 5/2008 | Asahara et al. | ................. 257/98 |
| 2005/0139842 A1 * | 6/2005 | Murofushi et al. | ............ 257/79 |

OTHER PUBLICATIONS

Xi, J.Q., et al.; "Internal high-reflectivity omni-directional reflectors"; App. Phy. Let.; 87, 031111 (2005).
Kim, Jong Kyu, et al.; "GaInN light emitting diodes with RuO2/SiO2/Ag omni-directional reflector"; App. Phy. Let.; 84, #22; May 31, 2004.

* cited by examiner

*Primary Examiner*—Davienne Monbleau
*Assistant Examiner*—Eduardo A Rodela
(74) *Attorney, Agent, or Firm*—Fernandez & Associates, LLP (57) ABSTRACT

A semiconductor device emitting light about a predetermined wavelength comprising a structure comprising a plurality of layers, sometimes referred to as a stack, providing low resistance, high reflectivity and ohmic contacts to at least one semiconductor material.

23 Claims, 7 Drawing Sheets

- 10 multi-layer stack structure
- ITO
- 20 reflective metal in vias to ohmic contact layer
- 12 ohmic contact layer
- 14 dielectric layer
- 16 DBR layers
- 18 reflective metal layer

Figure 4
Reflective Submount to p-side of Vertical Chip

HIGHLY REFLECTIVE MOUNTING ARRANGEMENT FOR LEDS

FIELD OF THE INVENTION

This invention relates to a reflective submount for light emitting devices (LEDs).

CROSS-REFERENCE TO RELATED DOCUMENTS

The present invention is related in part to application Ser. No. 11/296,006, "Light Emitter with Metal-oxide Coating" assigned to the same assignee is incorporated herein in its entirety by reference.

BACKGROUND OF INVENTION

Light emitting devices (LEDs) emit light in response to excitation by an electrical current. One typical LED includes a heterostructure grown on a substrate by metal-organic vapor phase epitaxy or similar techniques. A LED heterostructure includes n and p type semiconductor layers that sandwich light producing layers. Exemplary light producing layers may be quantum wells surrounded by barrier layers. Typically, electrical contacts are attached to n and p semiconductor cladding layers. When a forward bias is applied across electrical contacts electrons and holes flow from n and p layers into a light producing active region. Light is produced when these electrons and holes recombine with each other in an active region comprising at least one semiconductor material.

The efficiency with which a LED converts electricity to light is determined by the product of the internal quantum efficiency, the light-extraction efficiency, and losses due to electrical resistance; this product is also termed the external quantum efficiency. The internal quantum efficiency is determined by the quality of the semiconductor layers and the energy band structure of the device. Both of these are determined during deposition of semiconductor layers. The light extraction efficiency is the ratio of the light that leaves the LED chip to the light that is generated within the active layers. The light extraction efficiency is determined by the geometry of the LED, self-absorption of light in semiconductor layers, light absorption by electrical contacts, and light absorption by materials in contact with the LED that are used to mount a device in a package. Semiconductor layers have relatively high indexes of refraction; consequently, most light that is generated in an active region is internally-reflected by surfaces of a chip many times before it escapes. To achieve high light-extraction efficiency it is important to minimize absorption of light by the semiconductor layers and by electrical connections to the chip. When these layers are made to have very low optical absorption, by being transparent or highly reflective, the overall light extraction in an LED is improved substantially.

When an LED is energized, light emits from its active layer in all directions, impinging on the LED surfaces at many different angles. Typical semiconductor materials have a high index of refraction compared to ambient air, n=1.0, or encapsulating epoxy, n≈1.5. According to Snell's law, light traveling from a material having an index of refraction, $n_1$, to a material with a lower index of refraction, $n_2$, at an angle less than a certain critical angle $\theta_c$ relative to the surface normal direction will cross to the lower index region, where (1) $\quad \theta_C = \sin^{-1}(n_1/n_2)$ Light that reaches a semiconductor surface at angles greater than $\theta_C$ will experience total internal reflection. This light is reflected back into the LED chip where it can be absorbed within the chip or in metal contact layers that are attached to the chip. For conventional LEDs, the vast majority of light generated within the structure suffers total internal reflection at least once before escaping from a semiconductor chip. In the case of conventional GaN-based LEDs on sapphire substrates about 70% of emitted light is trapped between the sapphire substrate and the outer surface of the GaN. This light is repeatedly reflected, greatly increasing its chance for reabsorption and loss.

Several prior art approaches have been used to create reflective ohmic contacts for LEDs. The simplest is to use a thick sheet or layer of metal that has a high reflectivity. These include Al, Ag, Rh, Pd, Cu, Au, Cr, Ti, Ni, nickel/gold alloys, chrome/gold alloys, silver/aluminum mixtures, combinations of the preceding and others known to one familiar with the art. The chosen metal needs to not only have a high reflectance, but also make a low resistance ohmic contact. In the case of p-type AlInGaN, only Ag combines low electrical resistance with high reflectivity. Unfortunately, Ag presents a reliability concern because it is subject to tarnish and it is subject to electromigration during device operation. Also, the contact resistance of Ag-based contacts sometimes increases with time during device operation.

Wierer, et al., WO 01/47038 and U.S. Pat. No. 6,992,334, disclosed a multi-layer contact with one metal to make the ohmic connection to the device and a second metal to provide high reflectivity. The first metal may be a low reflectance metal because it is kept very thin, less than 20 nm, so that light penetrates through to the more reflective layer. The more reflective metal may be very thick to spread current effectively across the chip. The reflectivity of the combined metal stack can exceed 75%. However, these contacts are still too absorptive to achieve very high light-extraction because the reflectance of metals is limited to below about 93%; in addition, metals suitable for forming an ohmic contact are highly absorbing.

Schubert in U.S. Pat. No. 6,784,462 and in Applied Physics Letters, 84, 22, 31 May 2004, 4508, disclosed a reflective submount for an LED that interposed a dielectric layer under a portion of the metal contact to improve the overall reflectivity. In this scheme a plurality of ohmic contacts are made to the semiconductor using metal vias through the dielectric layer. The metal in these vias makes contact to spots on the semiconductor and a semiconductor layer spreads current between the spots. Schubert teaches a dielectric with a thickness chosen to be about one-quarter of a wavelength. This single dielectric layer serves to improve the reflectance compared to a simple metal reflector, but it does not provide for high reflectance for light incident at high angles, since the dielectric is so thin. The contact area to the semiconductor is small for these contacts which can significantly increase the resistance to electrical current flow, reducing the overall efficiency of the LED. Also, since the electrical contact is made in spots the current injection is not uniform over the surface of the chip. In the Applied Physics publication Schubert teaches that the " . . . micro-contact array covers only about 2% of the entire back side lit area of the LED chip." Schubert in Applied Physics Letters, 87, 031111 (2005), discloses an "omni-directional reflector" realized by the combination of total internal reflection using a low-refractive-index material and reflection from a one-dimensional photonic crystal. The low-refractive-index material is nanoporous $SiO_2$ with an index of refraction about 1.1; Schubert notes that n must be below 1.112 or the reflectivity falls off sharply. The one-dimensional photonic crystal structure is achieved with four pairs of very thin films of $TiO_2$ and $SiO_2$ with a very narrow tolerance on each film thickness. Schubert's data indicates quite good reflectivity; however the process he teaches is complex and has quite tight tolerances requiring very expensive process controls; low yields can be anticipated.

Dielectric Bragg reflectors, DBRs, have been disclosed in U.S. Pat. No. 6,552,369 wherein an epitaxially grown AlGaAs/AlInGaP structure is taught. In U.S. Pat. No. 5,585,648 the device comprises a SiC substrate with an optional DBR made from AlInGaN. U.S. Pat. No. 6,492,661 teaches a refection layer with a current blocking region; U.S. Pat. No. 6,492,661 also teaches substitution of an alternative substrate for an original substrate after device fabrication. U.S. Pat. No. 6,797,987 teaches a transparent, electrically-conductive oxide layer over coated with reflective layer; a substitute substrate replaces the original substrate; no oxide layer or Bragg reflector layer is taught.

Therefore a need exists for a reflector structure that provides for low-resistance contacts and conduction across a device while at the same time providing for high reflectance of light incident at all angles and can be manufactured in high volumes at low cost.

SUMMARY OF INVENTION

The instant invention discloses a reflective structure comprising a plurality of layers, sometimes referred to as a reflective stack, providing in various embodiments various combinations of low optical loss, high reflectivity, ohmic contacts and low manufacturing cost. In some embodiments a first, optically transmissive layer providing good ohmic contact across the device is deposited onto a semiconductor cladding layer and annealed, optionally. In an embodiment a first layer, comprising indium-tin oxide, ITO, makes ohmic contact to a semiconductor layer; the layer has high optical transmission for the wavelengths of interest with very low optical loss. Alternatives to ITO are Ni/Au and $RuO_2$ compositions. Next an optically transmissive, low-index of refraction, dielectric layer is deposited on the transmissive, ohmic contact layer. This dielectric layer may be made from SiO, $SiO_2$ or $MgF_2$, or another suitable dielectric known to one knowledgeable in the art. The dielectric layer provides for total internal reflection of light that is incident at high angles, angles far from the surface normal. Contrary to Schubert's teaching, this dielectric layer should be more than a quarter wavelength of the emitted light in the dielectric medium, preferably at least a half or, more preferably, three quarters of a wavelength or greater, so that the evanescent wave from incident light does not penetrate through it. Contrary to Schubert's alternative embodiment this dielectric layer may have an index of refraction greater than 1.12. Next, optionally, a dielectric, distributed Bragg reflector, DBR, is deposited. The DBR comprises alternating layers of high refractive and low refractive index films. The approximate thicknesses of each of the DBR layers is either $m\lambda/(4*n_H)$ or $k\lambda/(4* n_L)$; where $\lambda$ is the nominal wavelength of emitted light in air, $n_H$ is the index of refraction of the high index dielectric layer, $n_L$ is the index of refraction of the lower index dielectric layer and m and k are odd integers, preferably 1 or 3. The DBR need have only two pairs of the high and low refractive index films. The purpose of the DBR is to provide very high reflectance to light at angles near the surface normal. Next a metal layer is provided that makes contact with the ITO layer using a plurality of vias through the DBR and first dielectric layer. The metal layer has a reflectivity greater than 50% and preferably greater than 60% and is used to connect the ITO contact to a LED's substrate or submount. The area consumed by the vias should be as small as possible while providing for low resistance access to the ITO. The metal may contribute to the reflectance of the entire stack.

In an alternative embodiment a low resistance, high reflectivity, ohmic contact stack includes a transparent ITO contact, a thick, low index of refraction dielectric and a reflective metal with vias to the ITO contact; in this embodiment there is no dielectric DBR. In an alternative embodiment a low resistance, high reflectivity, ohmic contact stack also includes a last solderable metal layer such as AuSn for making contact to a submount, substrate, or an LED package. A solderable metal layer may comprise other layers such as Ni, Pt, TaN, TiWN or others known to one knowledgeable in the art that prevent migration of a solder layer to a stack structure.

In an alternative embodiment a thick, low index of refraction dielectric, a DBR and a reflective metal stack is deposited on the bottom of the original substrate onto which the LED layers are grown on the other surface. This structure improves the overall device light emission at the lowest possible additional manufacturing cost.

DETAILED DESCRIPTION

Figure 1:
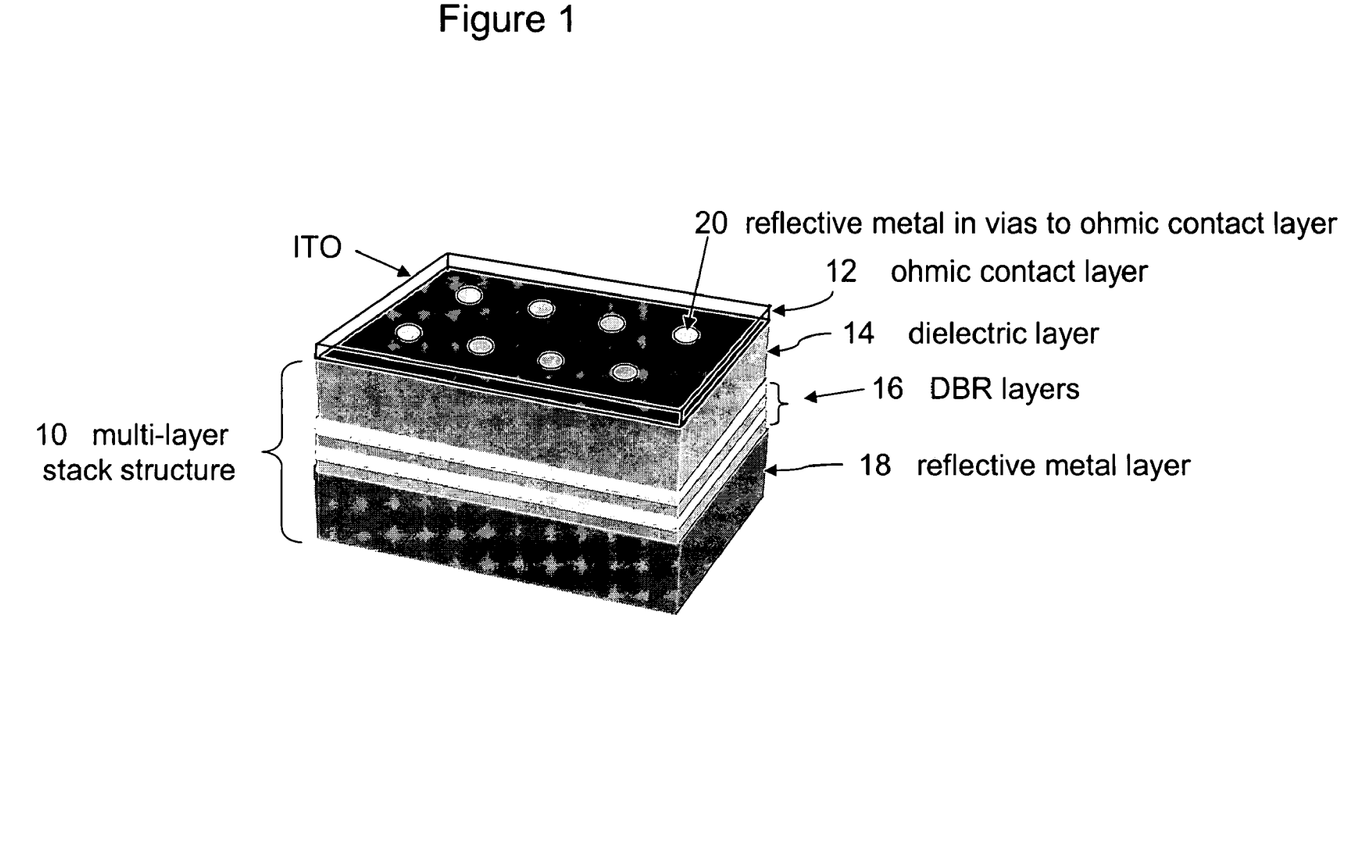
FIG. 1 is a cross-sectional view of a low resistance, high reflectivity, ohmic contact stack embodiment of the present invention.
Figure 4:
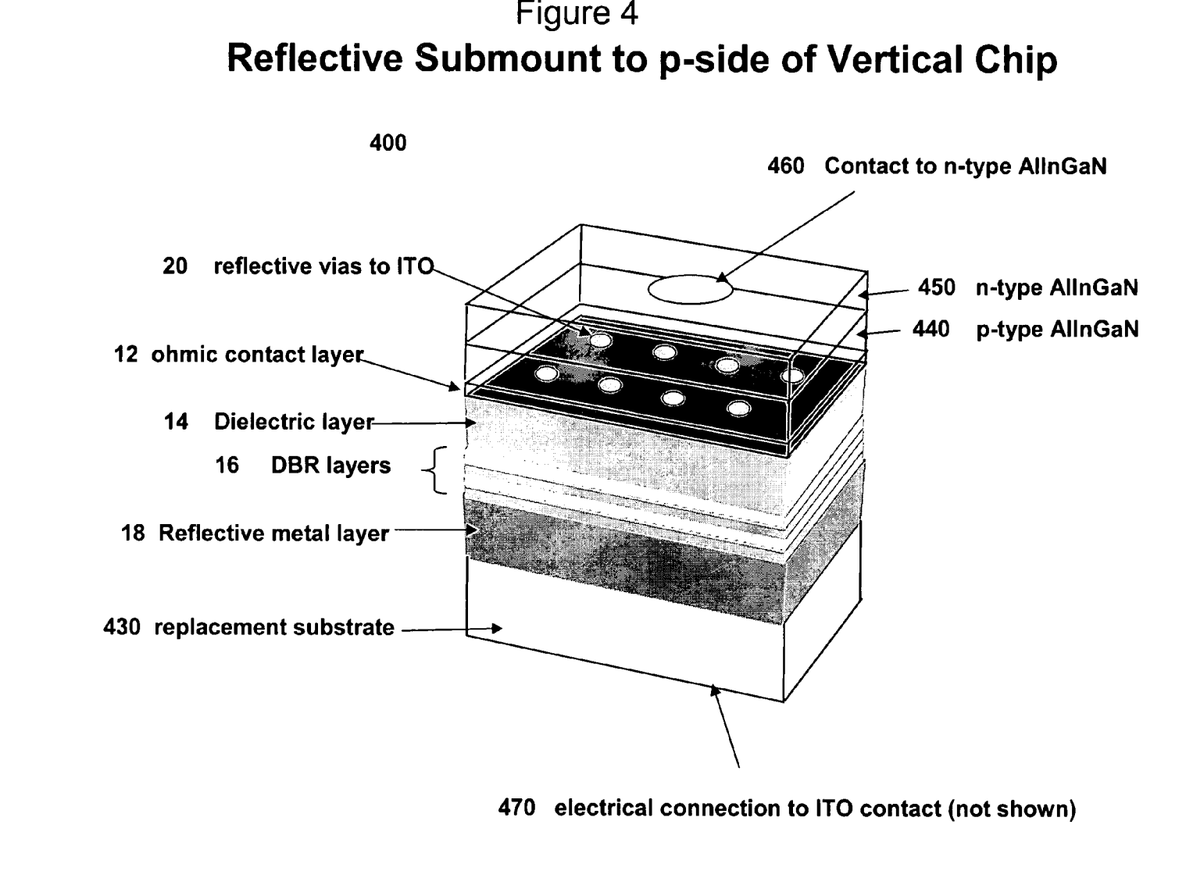
FIG. 4 is an LED incorporating one embodiment of the instant invention.

The present invention is a multi-layer arrangement which provides distinctive improvements over the prior art including, but not limited to, ohmic contacts to an LED, providing high reflectivity for light at all angles, low and, preferably, uniform contact resistance, and improved reliability. FIG. 1 shows a cross-sectional view of one embodiment of the present invention. In particular, FIG. 1 illustrates a stack structure to make ohmic connection to p-type AlInGaN alloys; one embodiment of LED semiconductor layers are shown in FIG. 4. A multilayer structure 10 includes a transparent, ohmic contact layer 12 for making a low-resistance, uniform contact to a p-type semiconductor material, for example AlInGaN. One example of a transparent, ohmic contact layer 12 is ITO, commonly formed by electron beam evaporation and preferably in the range of 50-400 nm thick. The thickness of a transparent, ohmic contact layer 12 is chosen to be sufficiently thick to provide for low-resistance between metallized vias, but thin enough to minimize optical absorption in the layer. An ITO layer may be annealed at elevated temperatures, in a predetermined ambient to improve its transparency and conductivity and reduce the electrical resistance of the contact to a AlInGaN or other semiconductor layer. Additional layers of a multi-layer stack structure are designed to make a reflective connection between a transparent contact and a substrate or submount on which a LED is attached. Transmissive contact layer 12 may be of indium tin oxide, ITO; alternatively, a transmissive contact layer may be of nickel/gold (Ni/Au) alloys, $In_2O_3$, $SnO_2$, CdO, ZnO, $CuAlO_2$, $CuGaO_2$, $SrCuO_2$ or other compositions having high light transmission and ohmic contact properties known to one knowledgeable in the art.

As shown in FIG. 1, a next layer of a multi-layer stack structure is a dielectric layer 14 formed on ITO. In one embodiment a dielectric is $SiO_2$ deposited by electron beam evaporation, sputtering, plasma-enhanced chemical vapor deposition, spin-on glass or other methods known to one knowledgeable in the art. In a preferred embodiment, the thickness of a dielectric is in the range from 50-700 nm. More preferably, the thickness is several times thicker than $\lambda/4n$ where $\lambda$ is the nominal wavelength emitted by the LED in air and n is the refractive index of the dielectric layer, for instance, $SiO_2$. Unlike the teachings of Schubert, U.S. Pat. No. 6,784,462, the instant invention's dielectric layer is purposely of a thickness such that light incident on a multilayer stack at glancing angles will not penetrate through the dielectric layer; instead, light emitted through an ohmic contact layer undergoes total internal reflection and is reflected back into a LED light emitting portion structure with minimal loss. Materials other than $SiO_2$ may be used for a second stack layer provided they absorb minimal light from a LED; more preferably, a material for a second layer has a low index of refraction; an ideal material for a second stack layer is also a good heat conductor; this combination of properties is difficult to achieve in practice; engineering trade-offs must be made.

In one embodiment, an optional next layer in a multi-layer stack structure is a dielectric distributed Bragg reflector, DBR, 16, formed adjacent to dielectric layer, 14, using a combination of high and low refractive index materials. It is preferred that the two materials chosen have indexes of refraction that are as different as possible to maximize the reflectivity of a stack over all angles. Chosen materials should have also very low absorption at the wavelength emitted by the LED. In one preferred embodiment a high-index material is $TiO_2$ and a lower index material is $SiO_2$. Materials suitable for high index layers are titanium dioxide ($TiO_2$), $Ti_3O_5$, $Ti_2O_3$, TiO, $ZrO_2+TiO_2ZrO_2Nb_2O_5$, $CeO_2$, ZnS, $Al_2O_3$, niobium pentoxide ($Nb_2O_5$) and tantalum pentoxide ($Ta_2O_5$). Low index materials are SiO, $SiO_2$, and $MgF_2$; in some embodiments low and/or high refraction index materials may be polymers such as siloxane polymers or others known to one knowledgeable in the art. The thicknesses of DBR layers, preferably, are odd multiples of quarter wavelengths as previously described. The DBR materials are arranged such that a high index material is next to layer 14, the thick, low-index dielectric. In a preferred embodiment a two layer combination, or pair, of high $n_H$/low $n_L$ index of refraction materials is repeated at least twice giving a four layer structure of high $n_H$/low $n_L$/high $n_H$/low $n_L$. In the embodiment shown in FIG. 1 two pairs, 16, are shown; in many embodiments two pairs are sufficient to achieve very high reflectivity over all angles. Increasing the number of pairs above two marginally improves the reflectivity, but increases the complexity and cost of a LED. DBR layers may be deposited using evaporation, physical vapor deposition, atomic layer deposition, ALD, or other well known techniques.

A next layer in a multi-layer stack structure is a metallic layer 18, positioned adjacent to a DBR in this embodiment or next to a dielectric layer should a DBR not be present. Metallic layer 18 is preferably made from a material that has high reflectivity such as aluminum or silver and is sufficiently thick so that light cannot penetrate. A plurality of reflective metal filled vias 20 are provided through DBR and dielectric layers so that a metal can make contact to ohmic contact layer 12. The portion of a multi-layer stack structure comprising vias will have lower reflectance than a region absent vias. To achieve high overall reflectivity the area of vias should be kept to a small fraction of the total area, preferably less than 10%. Spacing between vias is determined by the electrical conductivity of an ITO or other ohmic contacting and transmissive layer 12, which spreads a current preferably uniformly across a light emitting surface.

Figure 2:
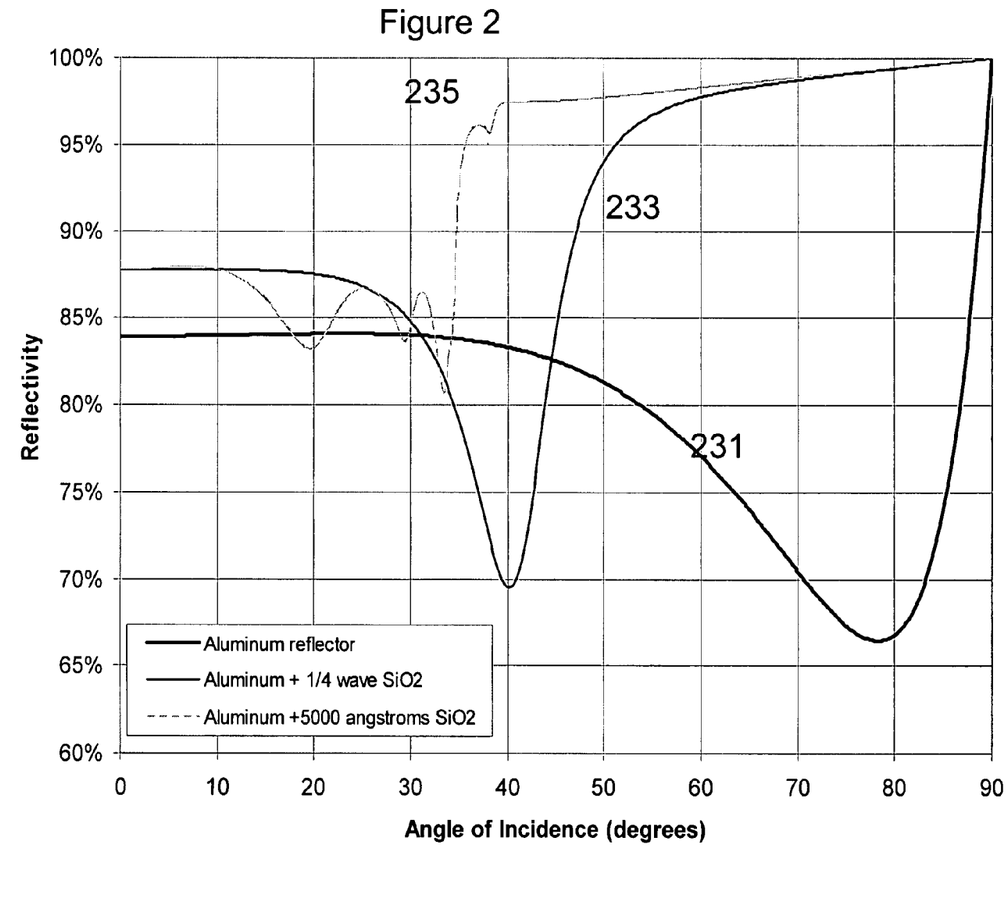
FIG. 2 illustrates the simulated effect of a relatively thick, low-index dielectric material on the reflectivity of a metallic reflector.
Figure 3:
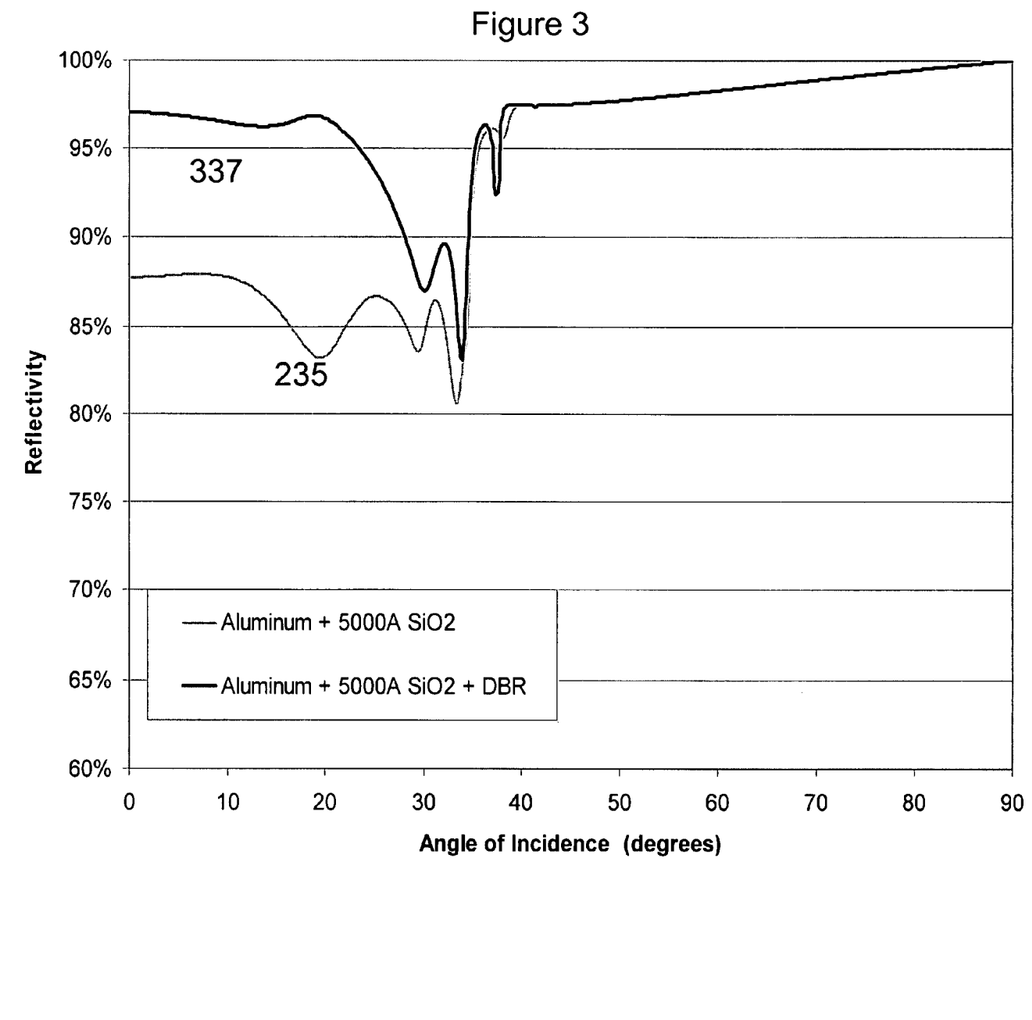
FIG. 3 illustrates the effect of both a relatively thick low-index material and a two pair $TiO_2/SiO_2$ DBR layer on the reflectivity of a metallic reflector.

FIGS. 2 and 3 illustrate how various portions of a multi-layer stack combine to provide for high reflectance. FIG. 2 is a calculation that shows the improvement in reflectivity of a metal contact by including a thick, low-index dielectric layer 14, such as the $SiO_2$ in FIG. 1. These calculations show the reflectance of light incident from ITO-coated GaN with an aluminum reflector 231. This is compared to the case 233 where a quarter wavelength layer of $SiO_2$ (800 angstroms) is between the ITO and the aluminum reflector, as taught by Schubert. Also shown is the reflectance for the case 235 where the $SiO_2$ layer is thick, in this case 5,000 angstroms. The reflectance is shown as a function of the angle of incidence of the light, where 0 degrees is normal incidence. An aluminum layer directly on ITO, curve 231, provides a reflectance of about 84% for light at normal incidence, falling off to about 67% at 78° before recovering to about 100% at 90°. The reflectance of a simple Al reflector being below 70% near 80 degrees, is undesirably low. The addition of a ¼ wavelength thick $SiO_2$ layer, curve 233, improves the normal angle reflectance to about 88% at normal incidence and more than 90% for angles larger than 47 degrees. However, the reflectance is still only about 70% for light incident at 40 degrees from normal incidence. This is because the evanescent wave "sees" through the $SiO_2$ to the aluminum. Also shown in FIG. 2 is one embodiment of the instant invention, curve 235, indicating the reflectance of a thick, 5,000 angstrom, $SiO_2$ layer between GaN and aluminum. In this embodiment of the instant invention the light undergoes almost total internal reflectance (TIR) at angles greater than about 40 degrees, such that the light suffers only minor absorption in the ITO or other conductive contact layer. In this embodiment the reflectance is more than 95% for all angles greater than 35 degrees. Also, the reflectance remains above 80% for all angles in distinct contrast to the prior art and teaching. For LEDs made according to instant invention embodiments with an appropriately chosen thickness dielectric layer, significantly improved extraction efficiencies are obtained.

FIG. 3 illustrates how an appropriately chosen thickness dielectric layer can be combined with a dielectric DBR stack to further improve emitted light reflectance at angles near normal incidence. By including a two pair $TiO_2/SiO_2$ DBR emitted light reflectance 337 is increased to about 97% between 0 and 20 degrees. Emitted light reflectance drops to as low as 85% at angles around 34 degrees then increases again at higher angles due to TIR. Averaged over all angles, emitted light reflectance 337 of this embodiment of the instant invention multilayer stack is far superior to previously disclosed prior art, while providing for a low resistance ohmic contact using a transparent conductive layer, optionally, ITO. Since light within a LED may strike a contacting arrangement many times before escaping a LED structure, the instant invention contacting layer structure described here results in a substantial increase in overall light extraction.

FIG. 4 shows an exemplary AlInGaN based LED structure 400 mounted using a multi-layer, reflector ohmic contact stack. A stack, such as shown in FIG. 1, 10, provides for contact to a p-type layer 440. A light emitting portion, comprising 440 and 450, is positioned p-side down on a reflective stack 10, comprising layers 20, 12, 14, 16 and 18; stack 10 is attached to substrate 430. In one embodiment, reflective stack 10 is attached to substrate by a solder layer, such as AuSn, or other suitable material that provides a low resistance contact, not shown. In one embodiment, electrical connection 470 to a p-contact is provided at a bottom of substrate 430. Light incident on a reflector stack is redirected upwards towards a surface of a chip where it escapes. A top surface of a chip may include textured features, not shown, to prevent light becoming trapped in semiconductor layers. Alternatively, a dielectric coating on a top surface of a chip includes features that scatter light out of trapped modes; these features may be textured in a film or be photonic crystal structures or other embodiments. A top surface of a LED has an n-contact 460 that is patterned to distribute current evenly across a top surface. Ideally a top contact should also be as reflective as possible, at least 50% and preferably more than 60%; top contact 460 can be made from a reflective metal such as aluminum. A n-type contact 460 may include a reflective stack similar to a p-contact, but only covering a small portion of a top surface.

Figure 5:
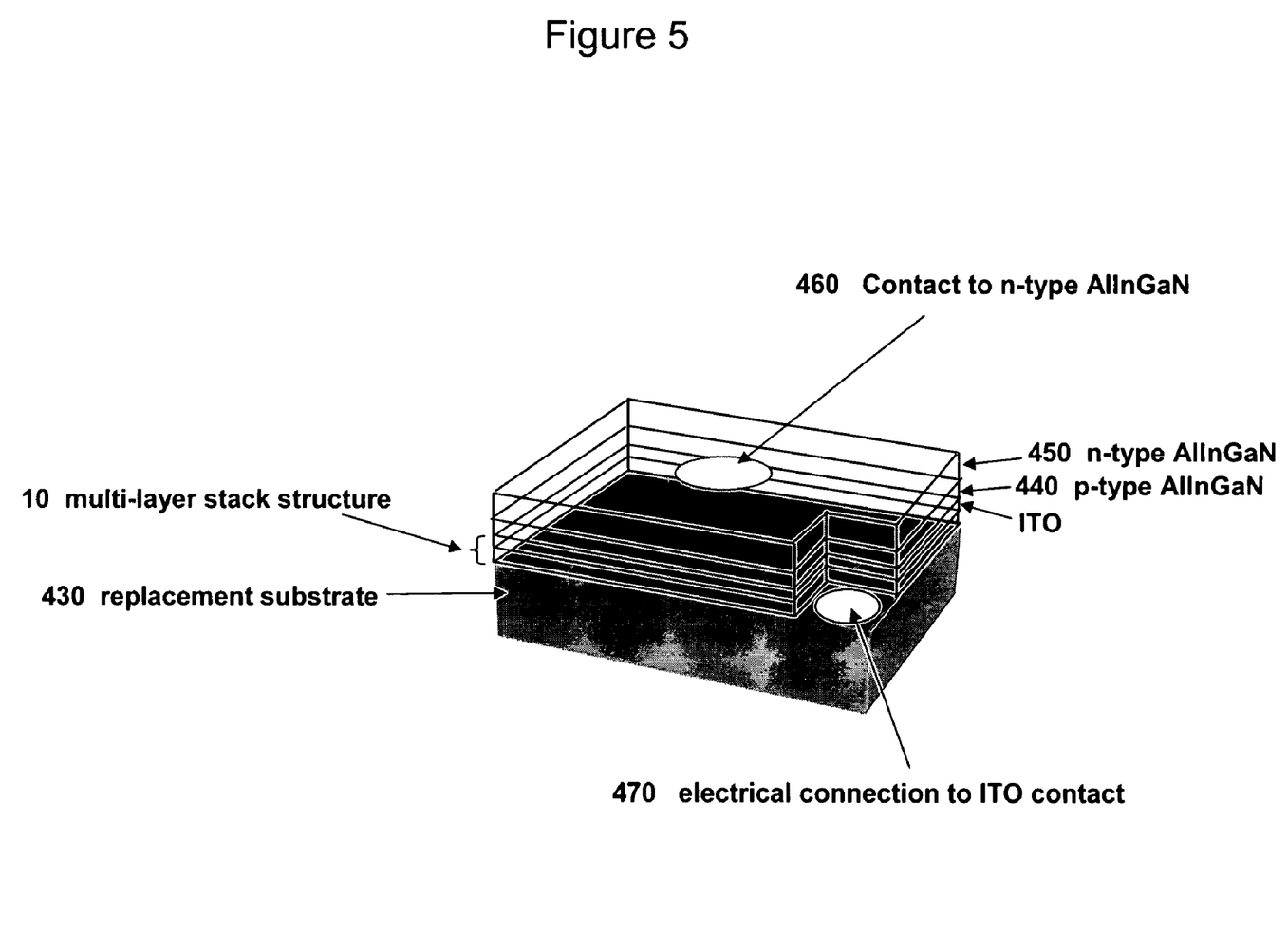
FIG. 5 is an alternative LED device structure that includes the instant invention.

FIG. 5 is an alternative embodiment of an LED utilizing a multi-layer reflector stack. In this embodiment access to a p-contact is made by removing the AlInGaN layers on a portion of a device. In this way electrical access to a p-metallization can be made from a top side of a chip. An insulating layer is used to provide electrical insulation between the semiconductor and the bottom of the substrate. This is desirable because LEDs can be mounted so that electrical current flow is isolated from the path of heat flow which is through the metallic substrate.

Figure 6:
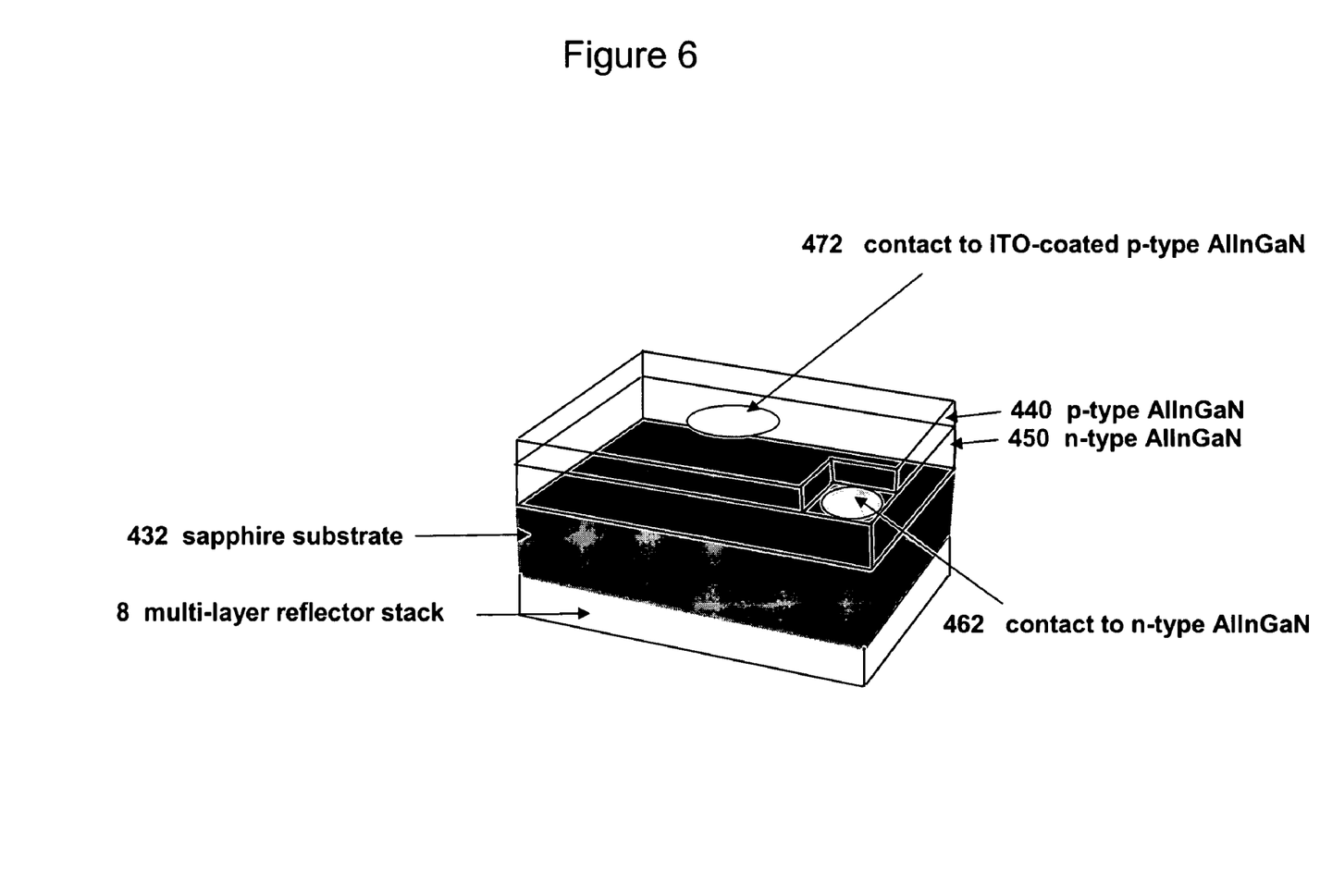
FIG. 6 is an alternative device emitting light structure comprising the instant invention under a sapphire substrate.

FIG. 6 is an alternative embodiment of an LED utilizing a multi-layer reflector stack 8 on a "bottom surface" of an LED device structure including a substrate of sapphire or SiC 432. In this embodiment an optically transmissive, low-index of refraction, dielectric layer is deposited on the substrate surface opposite the LED active layers. This dielectric layer may be made from SiO, $SiO_2$ or $MgF_2$, or another suitable dielectric known to one knowledgeable in the art. The dielectric layer provides for total internal reflection of light that is incident at high angles, angles far from the surface normal. Next, a dielectric, distributed Bragg reflector, DBR, is deposited. The DBR comprises alternating layers of high refractive and low refractive index films. The approximate thicknesses of each of the DBR layers is either $m\lambda/(4*n_H)$ or $k\lambda/(4* n_L)$; where $\lambda$ is the nominal wavelength of emitted light in air, $n_H$ is the index of refraction of the high index dielectric layer, $n_L$ is the index of refraction of the lower index dielectric layer and m and k are odd integers, preferably 1 or 3. Next a metal layer is provided that has a reflectivity greater than 50% and preferably greater than 60%; the metal may also comprise a diffusion barrier layer and a layer of material to facilitate solder attach. Multi-layer stack structure 8 comprises an optically transmissive, low-index of refraction, dielectric layer, a DBR comprising alternating layers of high refractive and low refractive index films and a metal layer comprising, optionally, a diffusion barrier layer and a layer of material to facilitate solder attach.

Figure 7:
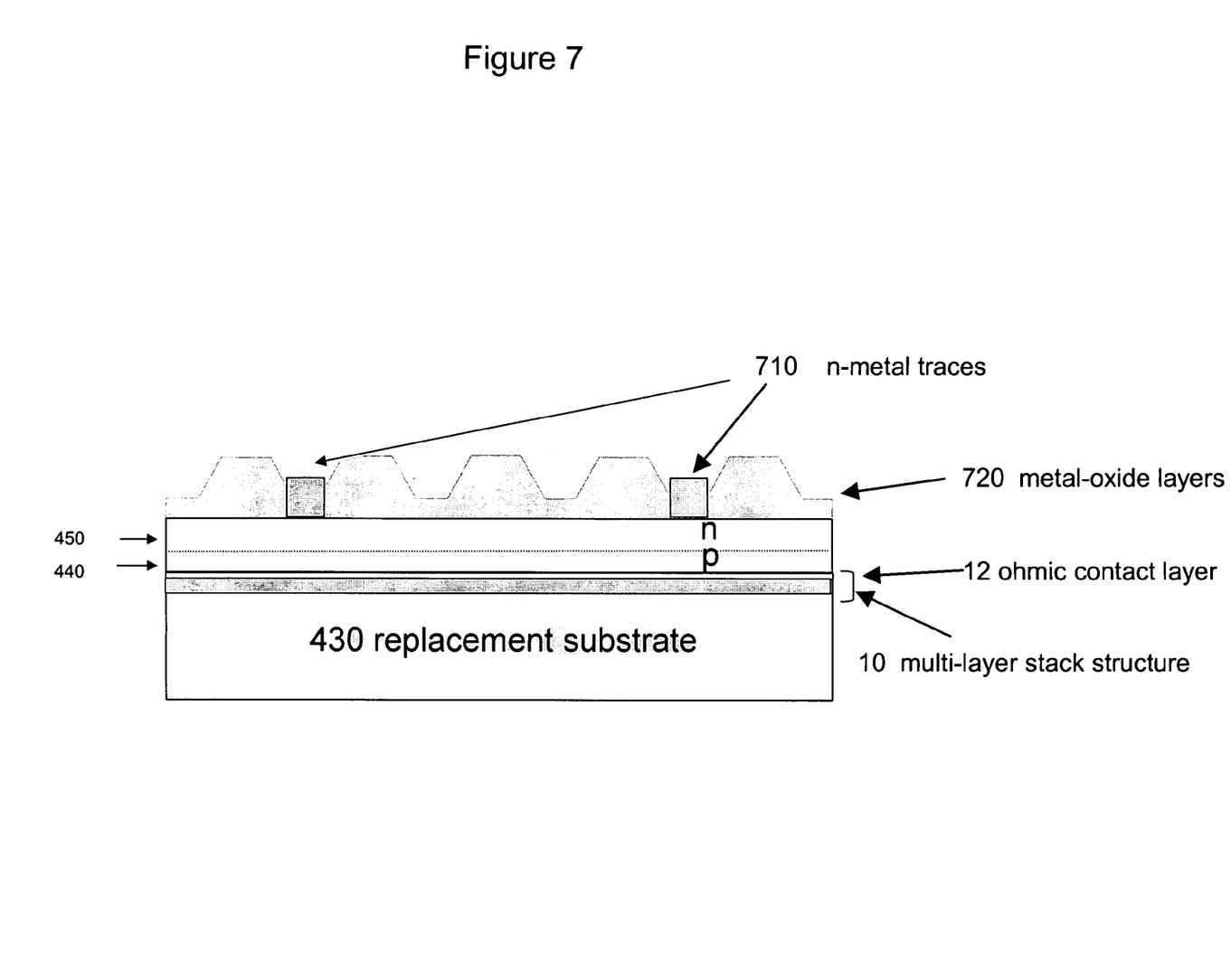
FIG. 7 is an alternative device emitting light structure comprising the instant invention wherein one or more top layers of metal oxide, optionally, have a predetermined shape and pattern.

FIG. 7 is an alternative device emitting light structure comprising the instant invention wherein one or more top layers of metal oxide 720 have a predetermined shape and pattern; metal conductors 710 provide contact to a n-type semiconductor light emitting portion; contact to a p-type light emitting portion is made with a transparent, ohmic contact layer 12 for making a low-resistance, uniform contact to a p-type semiconductor material, for example AlInGaN; other light emitting semiconductor materials are alternative embodiments. Multi-layer stack structure 10, as shown in FIG. 1 is an embodiment for a reflective stack as shown here; alternative stack embodiments are also possible with a metal-oxide layer also.

A metal-oxide layer in this application preferably comprises one or more layers wherein at least the first layer has an index of refraction greater than 2 and an optical extinction coefficient (the imaginary portion of the index of refraction) less than 0.2. A metal-oxide layer is chosen, preferably, from a group comprising metal oxides, silicon dioxide, silicon carbide, GaN, $Ta_2O_5$, $Nb_2O_5$, $TiO_2$, AlInGaN based solid solutions and their non-stoichiometric mixtures; optionally, a metal-oxide layer portion has a predetermined shape and pattern that enables a higher light extraction from a device emitting light.

All primary embodiments of the instant invention rely on a stack comprising a relatively thick, low-index of refraction dielectric film of predetermined minimum thickness and a minimum reflectivity metallic layer. Alternative embodiments comprise, optionally, adding a transmissive, ohmic contact layer and a predetermined number of alternating dielectric layers of predetermined thickness and index of refraction ranges. Light emission from a device emitting light, such as a LED, improves as the complexity of a stack increases; the cost increases as well; the instant invention allows the user to balance his light requirement against the cost. The teaching of U.S. application Ser. No. 11/296,006 may also be combined with the current disclosure to add metal-oxide films, optionally patterned, to a LED structure wherein metal-oxide films are deposited and, optionally, shaped and/or patterned on the LED surface not having a reflective stack, as shown in FIG. 7.

As used herein a substrate or submount portion provides at least a means for mechanical support for a light emitting device portion and metal-oxide coating portion. A substrate is chosen from a group comprising $Al_2O_3$, Si, SiC, AlInGaN based materials, metals, ceramics and glasses; these materials may be single crystal or not. A submount is chosen based on manufacturing convenience; typically a submount is chosen from a group comprising $Al_2O_3$, Si, SiC, metals, ceramics, plastics and glasses. A substrate comprises greater utility than a submount, as is well known; both provide a means for at least a thermal connection to a light emitting portion and in some embodiments either or both may provide a means for electrical connection to a light emitting portion.

As used herein a device emitting light or light emitting device, LED, is chosen from a group comprising light emitting diodes, light emitting heterojunctions, light emitting quantum well structures and other solid state devices capable of emitting light. As used herein a light emitting portion of an LED comprises active semiconductor layers or portions required to emit light and surrounding semiconductor layers required for conduction and contact. An original substrate, such as sapphire or SiC, upon which the device is fabricated initially are excluded in this definition. In cases where an initial substrate is removed a replacement substrate or submount is required typically for mechanical or handling or electrical connection purposes to enable an LED to function, optionally, in an "inverted" orientation. A highly reflective, ohmic contact resistance stack may be added to an LED structure with an original substrate; optionally, a highly reflective, ohmic contact resistance stack may be added to an LED structure as part of a process for attaching a replacement substrate.

One technique for separating a light emitting device portion from its original substrate is termed "laser liftoff". This technique is described in U.S. Pat. No. 6,071,795 and "Laser Liftoff of Gallium Nitride from Sapphire Substrates"; Sands, T., et al.; Nov. 18, 2005: http://www.ucop.edu/research/micro/98_99/98_133.pdf. An alternative description is provided by Ambacher, O., et al., "Laser Liftoff and Laser Patterning of Large Free-standing GaN Substrates"; Mat. Res. Soc. Symp., Vol. 617, © 2000 Materials Research Society. All three publications are included in their entirety herein by reference. One knowledgeable in the art of silicon on insulator wafer processing is familiar with alternative methods for transferring an active layer(s) to another substrate.

Foregoing described embodiments of the invention are provided as illustrations and descriptions. They are not intended to limit the invention to precise form described. In particular, it is contemplated that functional implementation of invention described herein may be implemented equivalently. Alternative construction techniques and processes are apparent to one knowledgeable with integrated circuit and MEMS technology. Other variations and embodiments are possible in light of above teachings, and it is thus intended that the scope of invention not be limited by this Detailed Description, but rather by Claims following.

What we claim is:

1. A device capable of emitting light about a predetermined nominal wavelength in response to an applied electric current comprising:
   a light emitting portion comprising at least one semiconductor material;
   first optically transmissive, ohmic contact layer coupled to the light emitting portion;
   second optically transmissive, dielectric layer with a refractive index less than the at least one semiconductor material and of a thickness greater than one-quarter wavelength of the predetermined nominal wavelength divided by the index of refraction of the second optically transmissive, dielectric layer coupled to the first optically transmissive, ohmic contact layer;
   one or more third layers wherein each one or more third layers comprises a first dielectric layer of high-index of refraction and a second dielectric layer of low-index of refraction wherein the first dielectric layer is of a thickness about $m\lambda/4n_H$, and the second dielectric layer is of a thickness about $k\lambda/4n_L$; and
   a metallic layer coupled to the one or more third layers and in contact with the second optically transmissive, dielectric layer and to the first optically transmissive, ohmic contact layer by more than one via through the one or more third layers and the second optically transmissive dielectric layer; wherein the reflectivity of the metallic layer to the predetermined nominal wavelength is greater than about 50 percent.

2. The device of claim 1 wherein said metallic layer comprises at least three layers comprising:
   a first layer comprising said metallic layer;
   a second layer comprising a diffusion barrier; and
   a third layer of a solderable material; wherein elements of the solderable material are prevented from reaching said metallic layer by the second layer.

3. The device of claim 1 wherein said optically transmissive, dielectric layer is chosen from a group comprising silicon dioxide, silicon monoxide, MgF$_2$ and siloxane polymers.

4. The device of claim 1 wherein said first dielectric layer of high-index of refraction of said one or more second layers is chosen from a group comprising titanium dioxide (TiO$_2$), Ti$_3$O$_5$, Ti$_2$O$_3$, TiO, ZrO$_2$+TiO$_2$ZrO$_2$Nb$_2$O$_5$, CeO$_2$, ZnS, Al$_2$O$_3$, niobium pentoxide (Nb$_2$O$_5$), tantalum pentoxide (Ta$_2$O$_5$) and siloxane polymers and said second dielectric layer of low-index of refraction of said one or more second layers is chosen from a group comprising SiO, SiO$_2$, MgF$_2$ and siloxane polymers.

5. The device of claim 1 wherein said optically transmissive, ohmic contact layer is chosen from a group comprising indium-tin oxide, nickel/gold alloys and ruthenium dioxide, RuO$_2$.

6. The device of claim 1 wherein said metallic layer is chosen from a group comprising Al, Ag, Rh, Pd, Cu, Au, Cr, Ti, Ni, nickel/gold alloys, chrome/gold alloys, silver/aluminum mixtures and combinations thereof.

7. A device capable of emitting light about a predetermined nominal wavelength in response to an applied electric current comprising:
   a light emitting portion comprising at least one semiconductor material and a first and second surface wherein the light is emitted from the first and second surfaces and the second surface is substantially coupled to an optically transmissive, ohmic contact layer;
   first optically transmissive dielectric layer with a refractive index less than the at least one semiconductor material and of a thickness greater than one-quarter wavelength of the predetermined nominal wavelength divided by the index of refraction of the first optically transmissive, dielectric layer coupled to the optically transmissive, ohmic contact layer
   one or more second layers coupled to the first optically transmissive dielectric layer comprising a first dielectric layer of high-index of refraction and a second dielectric layer of low-index of refraction wherein the first dielectric layer is of a thickness about $m\lambda/4n_H$, and the second dielectric layer is of a thickness about $k\lambda/4n_L$, where m and k are odd integers, $\lambda$ is the predetermined nominal wavelength, $n_H$ is the refractive index of the high-index of refraction dielectric layer and $n_L$ is the refractive index of the low-index of refraction dielectric layer;
   a metallic layer coupled to the one or more second layers and in contact with the first optically transmissive dielectric layer and to the optically transmissive, ohmic contact layer by more than one via through the one or more second layers and the first optically transmissive dielectric layer; wherein the reflectivity of the metallic layer to the predetermined wavelength is greater than 50 percent; and
   a means for mounting the light emitting device; wherein the metallic layer is thermally coupled to the means for mounting and makes at least one electrical contact to the means for mounting.

8. The device of claim 7 wherein said metallic layer comprises at least three layers comprising:
   a first layer comprising said metallic layer;
   a second layer comprising a diffusion barrier; and
   a third layer of a solderable material; wherein elements of the solderable material are prevented from reaching said metallic layer by the second layer.

9. The device of claim 7 wherein said optically transmissive, dielectric layer is chosen from a group comprising silicon dioxide, silicon monoxide, MgF$_2$ and siloxane polymers.

10. The device of claim 7 wherein said first dielectric layer of high-index of refraction of said one or more second layers is chosen from a group comprising titanium dioxide (TiO$_2$), Ti$_3$O$_5$, Ti$_2$O$_3$, TiO, ZrO$_2$+TiO$_2$ZrO$_2$Nb$_2$O$_5$, CeO$_2$, ZnS, Al$_2$O$_3$, niobium pentoxide (Nb$_2$O$_5$), tantalum pentoxide (Ta$_2$O$_5$) and siloxane polymers and said second dielectric layer of low-index of refraction of said one or more second layers is chosen from a group comprising SiO, SiO$_2$, MgF$_2$ and siloxane polymers.

11. The device of claim 7 wherein said optically transmissive, ohmic contact layer is chosen from a group comprising indium-tin oxide, nickel/gold alloys and ruthenium dioxide, RuO$_2$.

12. The device of claim 7 wherein said metallic layer is chosen from a group comprising Al, Ag, Rh, Pd, Cu, Au, Cr, Ti, Ni, nickel/gold alloys, chrome/gold alloys, silver/aluminum mixtures and combinations thereof.

13. The device of claim 7 further comprising a metal-oxide layer coupled to said first surface of said light emitting portion wherein the metal-oxide layer comprises one or more layers wherein at least the first layer has an index of refraction greater than 2 and an optical extinction coefficient less than 0.2.

14. The light emitting device of claim 13 wherein said metal-oxide layer is chosen from a group comprising metal oxides, silicon dioxide, silicon carbide, GaN, Ta$_2$O$_5$, Nb$_2$O$_5$, TiO$_2$, AlInGaN based solid solutions and their non-stoichiometric mixtures, and wherein said metal-oxide layer portion has a predetermined shape and pattern.

15. A device capable of emitting light about a predetermined wavelength in response to an applied electric current comprising:
a light emitting portion comprising at least one semiconductor material and a first and second surface wherein the light is emitted from the first and second surfaces and the second surface is substantially coupled to an optically transmissive, ohmic contact layer;
at least one electrical contact on the first surface of the light emitting portion comprising an ohmic contact layer and patterned metallization suitable for at least one external electrical connection over at least one portion of the ohmic contact layer;
first optically transmissive, dielectric layer with a refractive index less than the at least one semiconductor material and of a thickness greater than one-quarter wavelength of the predetermined wavelength divided by the index of refraction of the optically transmissive dielectric layer coupled to the optically transmissive, ohmic contact layer
one or more second layers coupled to the first optically transmissive dielectric layer wherein each one or more second layers comprises a first dielectric layer of high-index of refraction and a second dielectric layer of low-index of refraction wherein the first dielectric layer is of a thickness about m$\lambda$/4n$_H$, and the second dielectric layer is of a thickness about k$\lambda$/4n$_L$, where m and k are odd integers, $\lambda$ is the predetermined nominal wavelength, n$_H$ is the refractive index of the high-index of refraction dielectric layer and n$_L$ is the refractive index of the low-index of refraction dielectric layer;
a metallic layer coupled to the one or more second layers and in contact with the optically transmissive, dielectric layer and to the first optically transmissive, ohmic contact layer by more than one via through the one or more second layers, and the first optically transmissive dielectric layer; wherein the reflectivity of the metallic layer to the predetermined wavelength is greater than 50 percent; and
a means for mounting the device; wherein the metallic layer is at least thermally coupled to the means for mounting.

16. The device of claim 15 wherein said metallic layer comprises at least three layers comprising:
a first layer comprising said metallic layer;
a second layer comprising a diffusion barrier; and
a third layer of a solderable material; wherein elements of the solderable material are prevented from reaching said metallic layer by the second layer.

17. The device of claim 15 wherein said optically transmissive, dielectric layer is chosen from a group comprising silicon dioxide, silicon monoxide, MgF$_2$ and siloxane polymers.

18. The device of claim 15 wherein said first dielectric layer of high-index of refraction of said one or more second layers is chosen from a group comprising titanium dioxide (TiO$_2$), Ti$_3$O$_5$, Ti$_2$O$_3$, TiO, ZrO$_2$+TiO$_2$ZrO$_2$Nb$_2$O$_5$, CeO$_2$, ZnS, Al$_2$O$_3$, niobium pentoxide (Nb$_2$O$_5$), tantalum pentoxide (Ta$_2$O$_5$) and siloxane polymers and said second dielectric layer of low-index of refraction of said one or more second layers is chosen from a group comprising SiO, SiO$_2$, MgF$_2$ and siloxane polymers.

19. The device of claim 15 wherein said optically transmissive, ohmic contact layer is chosen from a group comprising indium-tin oxide, nickel/gold alloys and ruthenium dioxide, RuO$_2$.

20. The device of claim 15 wherein said metallic layer is chosen from a group comprising Al, Ag, Rh, Pd, Cu, Au, Cr, Ti, Ni, nickel/gold alloys, chrome/gold alloys, silver/aluminum mixtures and combinations thereof.

21. The device of claim 15 further comprising a metal-oxide layer coupled to said ohmic contact layer wherein the metal-oxide layer comprises one or more layers wherein at least the first layer has an index of refraction greater than 2 and an optical extinction coefficient less than 0.2.

22. The light emitting device of claim 21 wherein said metal-oxide layer is chosen from a group comprising metal oxides, silicon dioxide, silicon carbide, GaN, Ta$_2$O$_5$, Nb$_2$O$_5$, TiO$_2$, AlInGaN based solid solutions and their non-stoichiometric mixtures, and wherein said metal-oxide layer portion has a predetermined shape and pattern.

23. A method of improving light extraction efficiency of a device capable of emitting light about a predetermined wavelength in response to an applied electric current comprising the steps: coupling an optically transmissive, ohmic contact layer to a light emitting portion of the device;
coupling first surface of an optically transmissive, dielectric layer of a thickness greater than one-quarter wavelength of the predetermined wavelength divided by the index of refraction of the optically transmissive dielectric layer to the optically transmissive, ohmic contact layer; and
coupling a first surface of one or more second layers to a second surface of the optically transmissive, dielectric layer wherein each one or more second layers comprises a first dielectric layer of high-index of refraction and a second dielectric layer of low-index of refraction wherein the first dielectric layer is of a thickness about m$\lambda$/4n$_H$, and the second dielectric layer is of a thickness about k$\lambda$/4n$_L$, where m and k are odd integers, $\lambda$ is the predetermined nominal wavelength in air, n$_H$ is the refractive index of the high-index of refraction dielectric layer and $n_L$ is the refractive index of the low-index of refraction dielectric layer; and coupling a metallic layer to a second surface of the one or more second layers and in contact with the optically transmissive, dielectric layer and to the optically transmissive, ohmic contact layer by more than one via through the one or more second layers and the optically transmissive, dielectric layer; wherein the reflectivity of the metallic layer to the predetermined wavelength is greater than 50 percent.

* * * * *